United States Patent [19]

Tihanyi

[11] Patent Number: 4,631,565

[45] Date of Patent: Dec. 23, 1986

[54] MISFET WITH INPUT AMPLIFIER

[75] Inventor: Jenö Tihanyi, Munich, Fed. Rep. of Germany

[73] Assignee: Siemens Aktiengesellschaft, Berlin and Munich, Fed. Rep. of Germany

[21] Appl. No.: 557,712

[22] Filed: Dec. 2, 1983

[30] Foreign Application Priority Data

Jan. 19, 1983 [DE] Fed. Rep. of Germany ....... 3301648

[51] Int. Cl.⁴ .................... H01L 29/78; H01L 27/02
[52] U.S. Cl. .................................. 357/23.4; 357/42; 357/46; 357/23.14
[58] Field of Search ............... 357/23.4, 42, 46, 43, 357/23.14

[56] References Cited

U.S. PATENT DOCUMENTS

| | | | |
|---|---|---|---|
| 4,190,850 | 2/1980 | Tihanyi et al. | 357/23 |
| 4,345,265 | 8/1982 | Blanchard | 357/23.4 |
| 4,402,003 | 8/1983 | Blanchard | 357/46 |
| 4,455,565 | 6/1984 | Goodman et al. | 357/23.4 |
| 4,541,001 | 9/1985 | Schutten | 357/23.14 |
| 4,547,791 | 10/1985 | Roger et al. | 357/43 |

FOREIGN PATENT DOCUMENTS

| | | | |
|---|---|---|---|
| 0065269 | 11/1982 | European Pat. Off. | 357/43 |
| 2703877 | 6/1982 | Fed. Rep. of Germany | 357/23 |

Primary Examiner—Martin H. Edlow
Assistant Examiner—Terri M. Henn
Attorney, Agent, or Firm—John Francis Moran

[57] ABSTRACT

A power FET is preceded by an input amplifier consisting of a second FET of the same channel type and a third FET of an opposite channel type. The FETs of the pre-amplifier can be integrated into the chip of the power FET without additional production steps if the power FET and the second FET are designed as vertical FETs and the third FET as a lateral FET. Through this semiconductor device, the relatively high input capacitance of power MISFETs, which results in slow switching speeds when driven by standard ICs, is overcome.

6 Claims, 5 Drawing Figures

MISFET WITH INPUT AMPLIFIER

BACKGROUND OF THE INVENTION

This invention relates to a semiconductor device with a substrate in which is contained a first vertical MISFET (Metal Insulator Semiconductor Field Effect Transistor) of a first channel type with a source zone on the substrate surface, a gate zone and a gate electrode whose drain zone is formed by the substrate.

Vertical MISFETS of this type are suited for power applications and have been described in German patent document DE-OS No. 27 03 877, for example. When driven directly, such as by ICs (integrated circuits) they are activated relatively slowly because of their high input capacitance. The switching speed could be increased by external driver circuits, however, such measures involve greater costs.

SUMMARY OF THE INVENTION

It is an object of the present invention to provide a semiconductor device of the above mentioned kind so that the switching speed can be increased without additional cost even in response to relatively low input power.

This object and others are realized by providing a semiconductor with the following features:

(a) The substrate contains another vertical MISFET of a first channel type with a source zone on the substrate surface, a gate zone and a gate electrode whose drain zone is formed by the substrate;

(b) the substrate contains a lateral MISFET of a second channel type with a source zone on the substrate surface and a drain zone on the substrate surface;

(c) the source zones of the other vertical MISFET and of the lateral MISFET are electrically connected to each other and to the gate electrode of the first vertical MISFET;

(d) the gate electrodes of the lateral MISFET and of the additional vertical MISFET are electrically connected to each other; and (e) the drain zone of the lateral MISFET is electrically connected to the source zone of the first vertical MISFET.

Other features and advantages of the invention will be apparent from the following description of the preferred embodiments, and from the claims.

For a full understanding of the present invention, reference should now be made to the following detailed description of the preferred embodiments of the invention and to the accompanying drawings.

DETAILED DESCRIPTION

Figure 1:
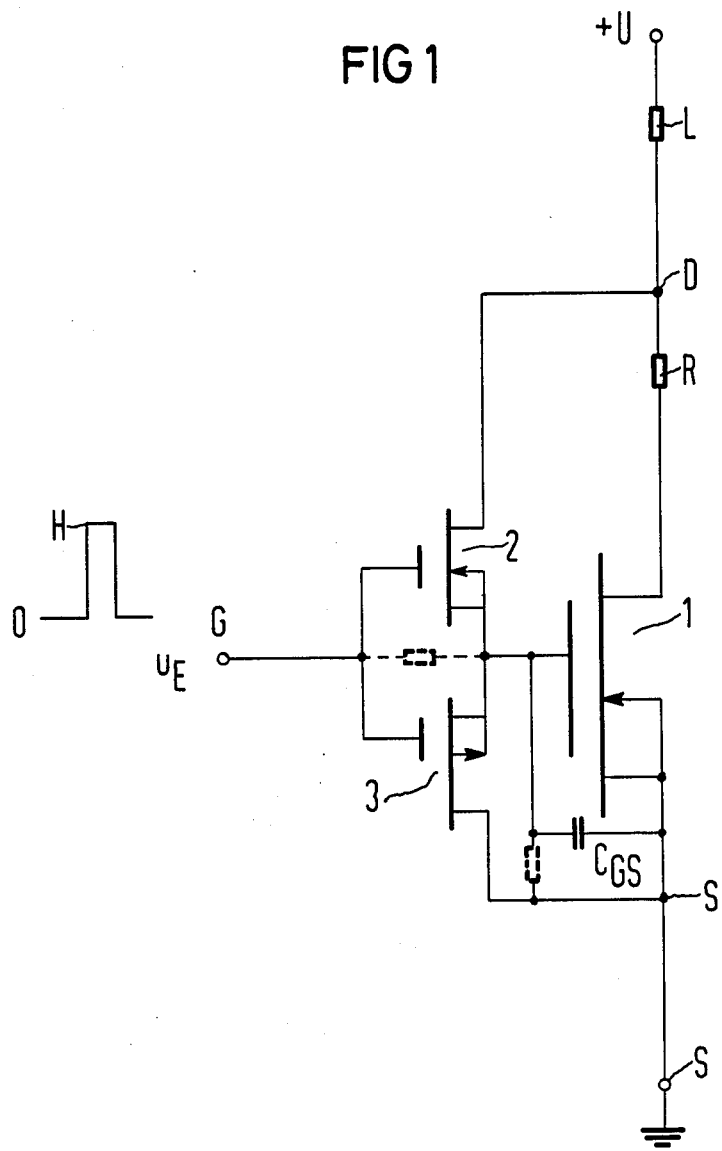
FIG. 1 shows an equivalent circuit diagram of a semiconductor arrangement according to a preferred embodiment of the invention.

In the equivalent circuit diagram according to FIG. 1, the power MISFET is marked with reference numeral 1. On the drain side of the MISFET 1 a resistor R representing the bulk resistance of the substrate is shown. Also, on the drain side, a voltage +U is applied to the FET 1 via the resistor R and a load L. At the source side a ground potential is applied, for instance, via the terminal S. In parallel with the MISFET 1 and its bulk resistance R is a series connection consisting of a second MISFET 2 of the same channel type and a third MISFET of an opposite channel type. The MISFETs 1 and 2 are shown as n-channel MISFETs while MISFET 3 is of the p-channel type. The source electrodes of MISFETs 2 and 3 are electrically connected to each other on the one hand and to the gate electrode of MISFET 1 on the other. The gate electrodes of MISFETs 2 and 3 form a pre-amplifier for MISFET 1. The gate/source capacitance $C_{GS}$ of the first MISFET 1 is shown in order to explain the operation of the device. If a signal voltage $U_E$ as shown in FIG. 1 is applied to the gate terminal G, the second FET 2 is biased on and a positive voltage appears at the gate electrode of FET 1. It charges the capacitance $C_{GS}$, and the FET 1 is activated. When the input voltage $U_E$ becomes zero again, the gate/source voltage stays positive at first at the FET 1 due to the charge stored in $C_{GS}$. This causes the potential at the source electrode of FET 3 to become positive relative to its gate potential, and FET 3 begins to conduct. This causes the capacitance $C_{GS}$ to discharge quickly, and the FET 1 is blocked.

Figure 2:
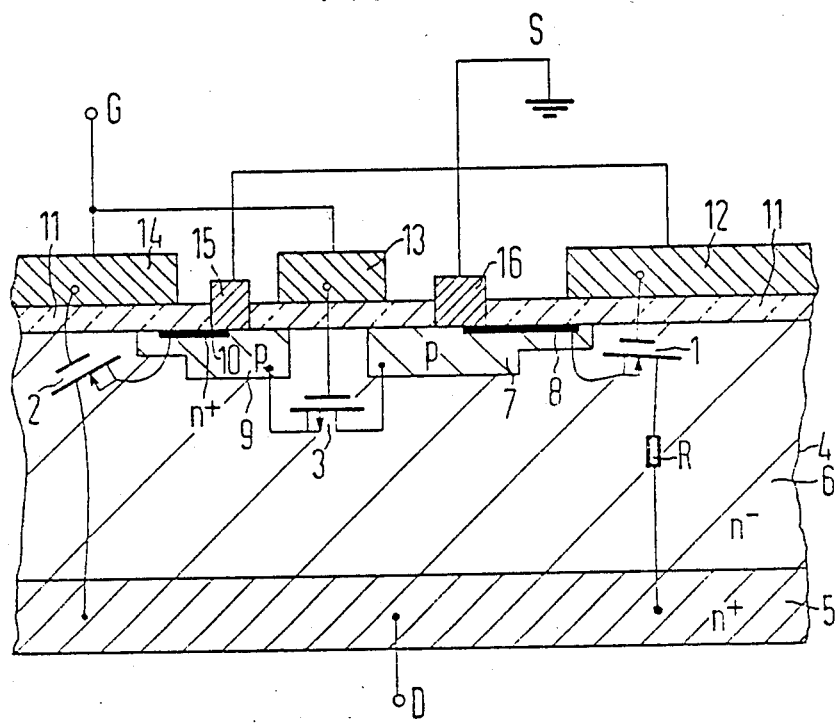
FIG. 2 shows an integrated circuit layout for a preferred embodiment.

For purposes of illustration the symbols of FET 1, 2 and 3 are shown in the sectional view of FIG. 2. The semiconductor device is disposed on a substrate comprising, for example, of an $n^+$-doped layer 5 and an $n^-$-doped layer 6. The latter may be an epitaxial layer, for example. Embedded in the surface of layer 6 are two p-conducting zones 7 and 9. The zones 7 and 9 form the drain zone and source zone, respectively, of FET 3. The latter is a lateral p-channel FET. Embedded in the zones 7, 9 are $n^+$-doped zones 8 and 10, respectively. They are the source zones for the first vertical FET 1 and second vertical FET 2, respectively. The zones 7, 9 also form the gate zones for FET 1 and FET 2. This arrangement provides a particularly effective utilization of the semiconductor material. However, the channel zones of the FETs 1 and 2 may also be separated spacially from the source and drain zones of FET 3. The zones 7, 8 and 9, 10 are respectively connected to each other electrically by a contact 16 and 15. Except for the areas where the contacts 15 abnd 16 are located, the surface of the substrate 4 is covered by an insulating layer 11 which may comprise silicon dioxide. Disposed on the layer 11 is a gate electrode 12 which covers part of gate zone 7 located between the source zone 8 and zone 6. The gate electrode 12 is coordinated with the FET 1. Two more gate electrodes 13, 14 are coordinated with the FETs 3 and 2, respectively.

The FET 3 is a p-channel lateral FET while FET 2 and FET 1 are n-channel vertical FETs. The FETs 2 and 3 can be produced simultaneously with FET 1 without additional manufacturing steps by producing the additional zones 9 and 10. To achieve a low channel resistance of FET 3, zones 7 and 9 are arranged close to each other, e.g. 10 to 20, $\mu$m. The width of its channel should be as great as possible for the same reason.

Figure 3:
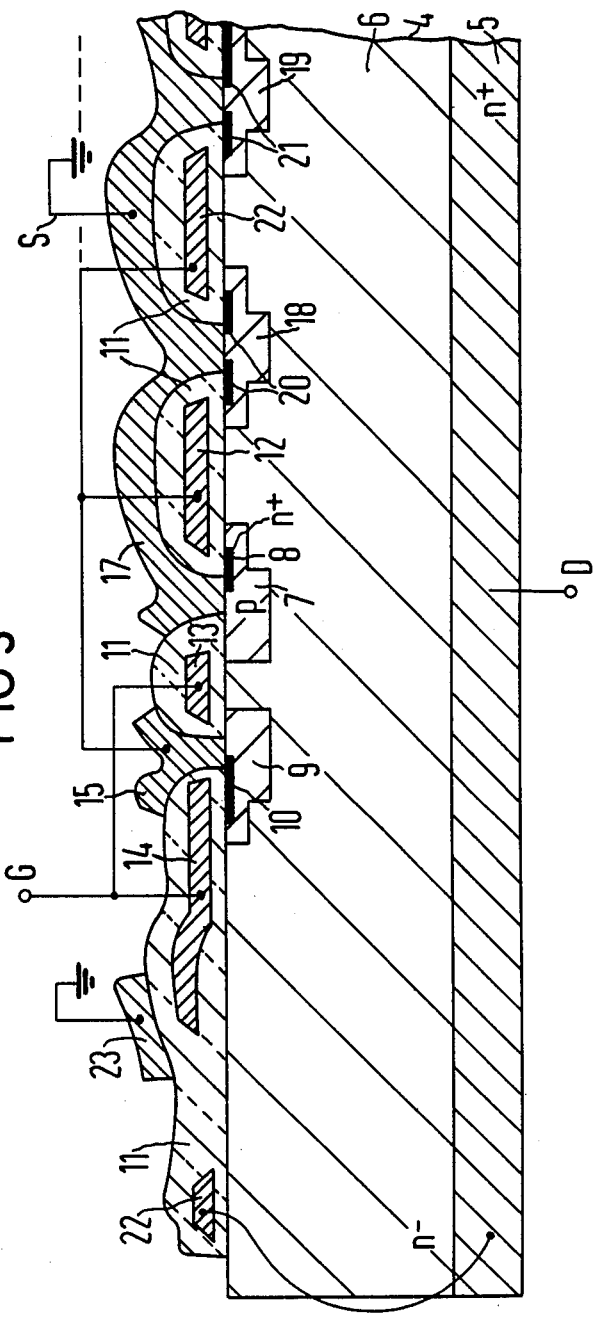
FIG. 3 shows another preferred embodiment of the invention.

The FETs 2 and 3, forming the pre-amplifier of the semiconductor arrangement, are preferably disposed at the edge of the substrate. Such a configuration is shown in FIG. 3. In FIG. 3, parts or elements identical with parts in FIG. 2 have the same reference symbols.

The substrate 4 has a multiplicity of first MISFETs, of which only a few are shown here. They have gate zones 18, 19, into which source zones 20, 21 are embedded. These first MISFETs are paralleled to each other by a metal layer 17. Associated with each first MISFET is a gate electrode 22 of which only one is shown. The gate electrode 22 is electrically connected to additional gate electrodes which may be provided and to the gate electrode 12. All gate electrodes are electrically connected to the zones 9, 10 via the contact 15.

The control electrode 14, located between the vertical MISFET 2 and the edge of the substrate 4, may be located further away from the substrate surface towards the edge rather than over the gate zone 9. This measure, together with a channel stopper 24 situated on the edge and an auxiliary electrode 23 overlapping the gate electrode 14 and electrically insulated from it by the insulating layer 11, serves the purpose of improving the distribution by spreading the edge field strength on the substrate surface.

Figure 4:
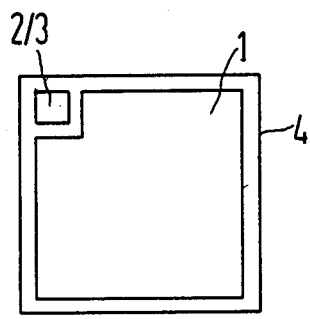
FIGS. 4 and 5 are top views of two embodiments in which the components of the semiconductor arrangement are coordinated differently.
Figure 5:
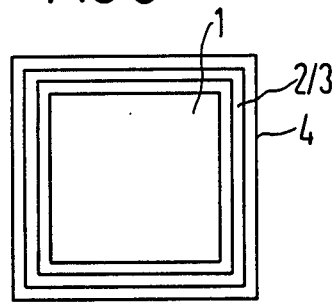

As shown in FIG. 3, the MISFETs 2, 3 of the input amplifier may be disposed at the edge of the substrate. They may be disposed within an area of the substrate 4 left vacant by the main FET 1, as shown in FIG. 4. But it is also possible to design the pre-amplifier FETs 2, 3 in a ring shape and arrange them between the edge of the substrate 4 and the FET 1. The illustration in FIGS. 4 and 5 is rather simplified and does not take into account the actual fine structure of the FETs 1, 2 and 3.

The invention is useful, for instance, for high-voltage MISFETs of a cut-off voltage starting at e.g. 500 V.

There has thus been shown and described a novel semiconductor device which fulfills all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

I claim:

1. A semiconductor device having a substrate, the substrate containing a first vertical MISFET of a first channel type including a first source zone and a gate zone controlled by a gate electrode, the drain zone of the first vertical MISFET is formed by the substrate, the first source zone and the gate zone extending from a first surface of said substrate into said substrate, an improvement comprising:

(a) a second vertical MISFET of said first channel type including a second source zone and a gate zone controlled by a gate electrode, the drain zone of the second vertical MISFET is formed by said substrate said second source zone and the gate zone of said second MISFET extending from said first surface into said substrate;

(b) a lateral MISFET of a second channel type with a source zone located on the first surface of said substrate and a drain zone located on the first surface, said source zones of said second vertical MISFET and of said lateral MISFET being electrically connected to each other and to the gate electrode of said first vertical MISFET, the gate electrodes of said lateral MISFET and of said second vertical MISFET being electrically connected to each other, and the drain zone of said lateral MISFET being electrically connected to the source zone of said first vertical MISFET;

(c) said gate zone of said first vertical MISFET and said drain zone of said lateral MISFET being a single zone and said source zone of said lateral MISFET and said gate zone of said second vertical MISFET being a single zone;

(d) the first source zone embedded in said drain zone of said lateral MISFET and bounded by the first surface and the second source zone embedded in said source zone of said lateral MISFET and being of an opposite conductivity type thereto; and (e) a first contact electrically connected to the first source zone of said first vertical MISFET and being electrically connected to said drain zone of said lateral MISFET, and a second contact electrically connected to the second source zone of said second vertical MISFET and being electrically connected to the source zone of said lateral MISFET.

2. A semiconductor device according to claim 1, wherein said substrate comprises a plurality of parallel-connected first vertical MISFETs and wherein said second vertical MISFET and said lateral MISFET are formed in a ring shape and are arranged between the edge of said substrate and said first vertical MISFET adjacent to said edge.

3. The semiconductor device of claim 2, wherein the first vertical MISFET is a power device and the second vertical MISFET and the lateral MISFET serve as an input amplifier to the first vertical MISFET.

4. A semiconductor device according to claim 1, wherein said substrate comprises a plurality of parallel-connected first vertical MISFETs and wherein said second vertical MISFET and said lateral MISFET occupy a substrate area left free by first vertical MISFETs.

5. The semiconductor device of claim 4, wherein the first vertical MISFET is a power device and the second vertical MISFET and the lateral MISFET serve as an input amplifier to the first vertical MISFET.

6. The semiconductor device of claim 1, wherein the first vertical MISFET is a power device and the second vertical MISFET and the lateral MISFET serve as an input amplifier to the first vertical MISFET.

* * * * *